United States Patent
Hong

(10) Patent No.: US 9,196,538 B2
(45) Date of Patent: Nov. 24, 2015

(54) SEMICONDUCTOR PACKAGE AND METHOD OF FABRICATING THE SAME

(71) Applicant: Samsung Electronics Co., Ltd., Suwon-si (KR)

(72) Inventor: Min gi Hong, Asan-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 64 days.

(21) Appl. No.: 13/950,292

(22) Filed: Jul. 25, 2013

(65) Prior Publication Data
US 2014/0038354 A1    Feb. 6, 2014

(30) Foreign Application Priority Data
Aug. 6, 2012  (KR) .......................... 10-2012-0085836

(51) Int. Cl.
| | |
|---|---|
| H01L 21/00 | (2006.01) |
| H01L 21/82 | (2006.01) |
| H01L 21/56 | (2006.01) |
| H01L 23/00 | (2006.01) |
| H01L 23/31 | (2006.01) |

(52) U.S. Cl.
CPC .............. *H01L 21/82* (2013.01); *H01L 21/561* (2013.01); *H01L 21/565* (2013.01); *H01L 23/3114* (2013.01); *H01L 23/3128* (2013.01); *H01L 24/97* (2013.01); *H01L 2224/16225* (2013.01); *H01L 2924/15151* (2013.01); *H01L 2924/15311* (2013.01); *H01L 2924/181* (2013.01)

(58) Field of Classification Search
CPC ........... H01L 2224/16225; H01L 2924/15311; H01L 2924/15151
See application file for complete search history.

(56) References Cited

U.S. PATENT DOCUMENTS

| | | | | | |
|---|---|---|---|---|---|
| 4,791,248 | A | * | 12/1988 | Oldenettel | 174/265 |
| 5,120,678 | A | * | 6/1992 | Moore et al. | 29/840 |
| 5,218,234 | A | * | 6/1993 | Thompson et al. | 257/787 |
| 5,710,071 | A | * | 1/1998 | Beddingfield et al. | 438/108 |
| 6,081,997 | A | * | 7/2000 | Chia et al. | 29/841 |
| 6,324,069 | B1 | * | 11/2001 | Weber | 361/783 |
| 6,451,625 | B1 | * | 9/2002 | Pu et al. | 438/108 |
| 6,490,166 | B1 | * | 12/2002 | Ramalingam et al. | 361/760 |

(Continued)

FOREIGN PATENT DOCUMENTS

| KR | 10-1999-0055277 A | 7/1999 |
|---|---|---|
| KR | 10-2006-0009086 A | 1/2006 |

(Continued)

*Primary Examiner* — Mary Wilczewski
*Assistant Examiner* — Erik T Peterson
(74) *Attorney, Agent, or Firm* — Muir Patent Law, PLLC

(57) ABSTRACT

Disclosed are semiconductor packages and methods of fabricating the same. A method may include preparing a wiring board including a mounting region and a molding region surrounding the mounting region; forming a through-hole penetrating through the wiring board at the mounting region; mounting a semiconductor chip on the mounting region of the wiring board by a flip chip bonding method; and forming a molding covering the molding region of the wiring board and the semiconductor chip and filling the through-hole and a space between the semiconductor chip and the wiring board. The wiring board may have a first surface on which the semiconductor chip is mounted, and a second surface opposite to the first surface. A portion of the molding filling the through-hole has a surface coplanar with the second surface of the wiring board.

18 Claims, 23 Drawing Sheets

(56) References Cited

U.S. PATENT DOCUMENTS

| | | |
|---|---|---|
| 6,610,560 B2 | 8/2003 | Pu et al. |
| 6,693,239 B2 * | 2/2004 | Myers et al. ............... 174/521 |
| 6,963,142 B2 * | 11/2005 | Bolken ....................... 257/797 |
| 7,700,414 B1 * | 4/2010 | San Antonio et al. ....... 438/118 |
| 2002/0092162 A1 * | 7/2002 | Tsai et al. ..................... 29/840 |
| 2002/0111016 A1 * | 8/2002 | Farquhar et al. ............ 438/637 |
| 2003/0113952 A1 * | 6/2003 | Sambasivam et al. ....... 438/108 |
| 2006/0125088 A1 * | 6/2006 | Huang et al. ................ 257/707 |
| 2008/0237833 A1 * | 10/2008 | Hsu et al. .................... 257/691 |
| 2009/0078956 A1 * | 3/2009 | Tseng et al. ................... 257/98 |
| 2009/0230566 A1 * | 9/2009 | Hisada et al. ............... 257/778 |
| 2011/0193228 A1 | 8/2011 | Yu et al. |
| 2012/0032328 A1 | 2/2012 | Lin et al. |
| 2012/0032337 A1 | 2/2012 | Lu et al. |

FOREIGN PATENT DOCUMENTS

| | | |
|---|---|---|
| KR | 10-2006-0009087 A | 1/2006 |
| KR | 10-2007-0005150 A | 1/2007 |
| KR | 10-2007-0069714 A | 7/2007 |
| KR | 10-2009-0036950 A | 4/2009 |
| KR | 10-2011-0071669 A | 6/2011 |
| KR | 10-2012-0032762 A | 4/2012 |

* cited by examiner

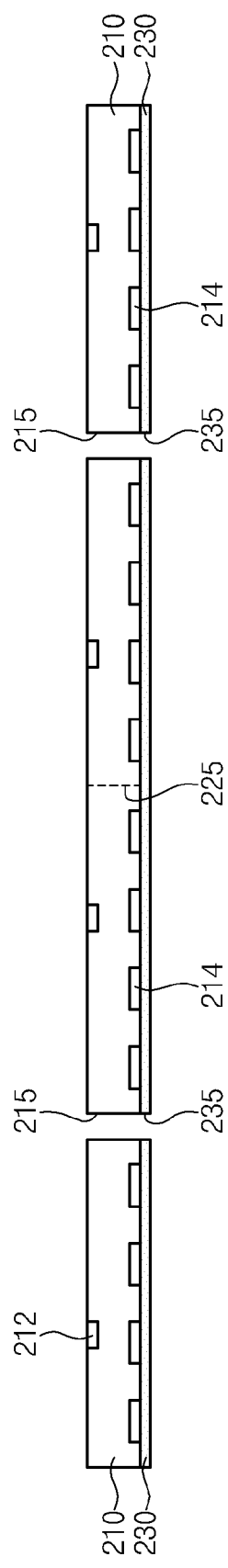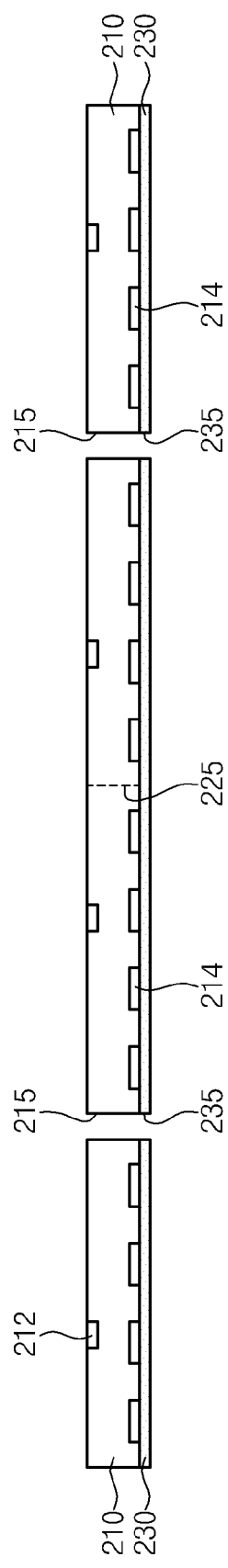

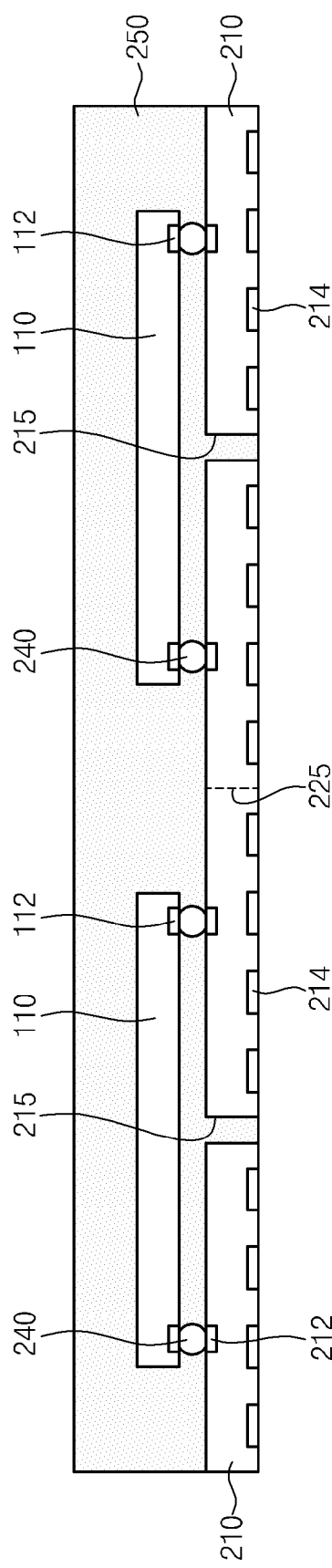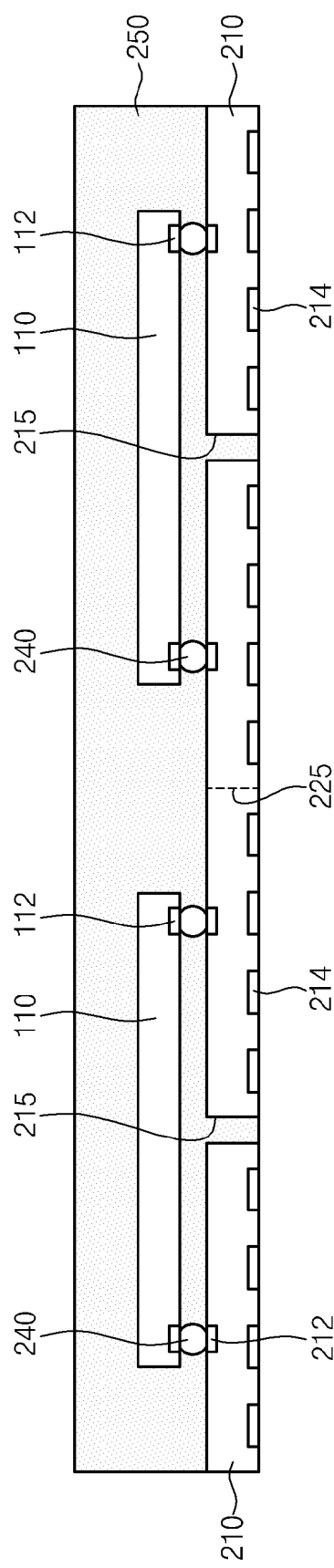

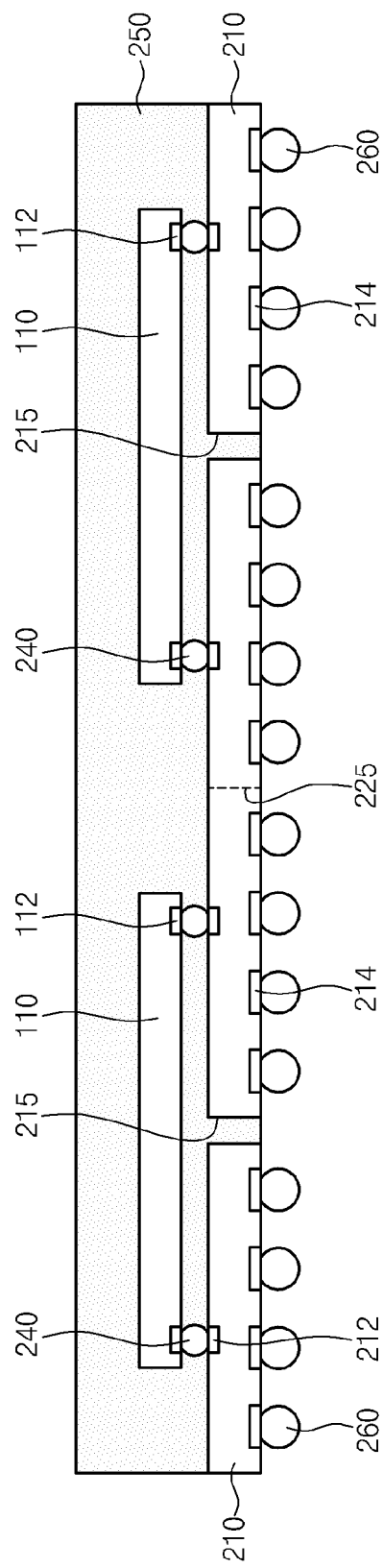
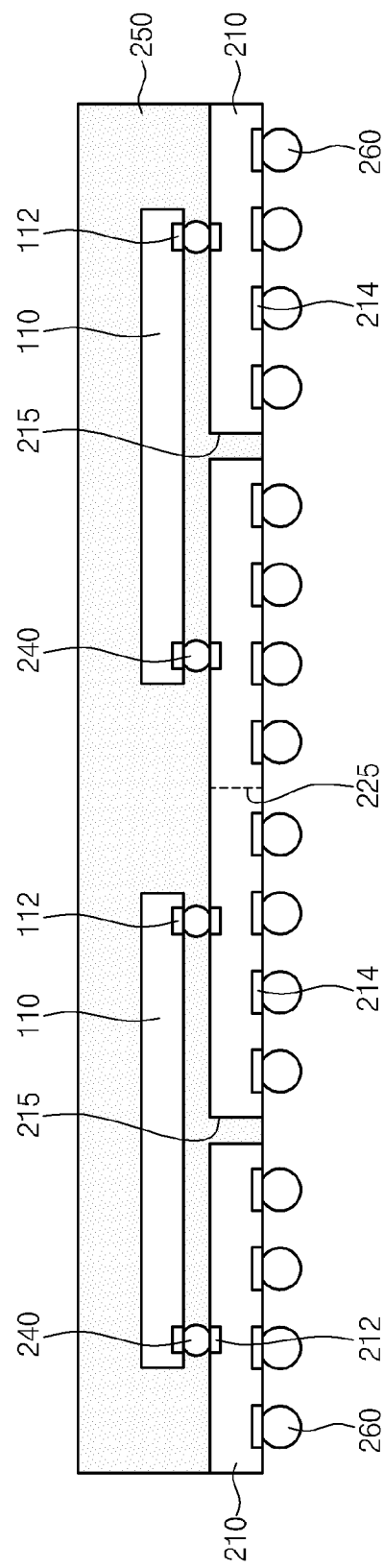

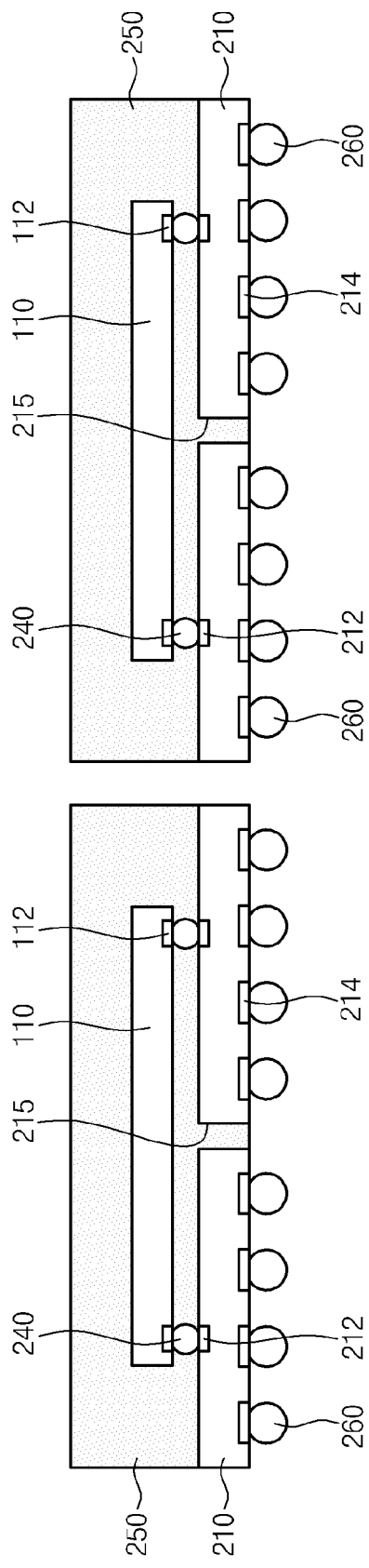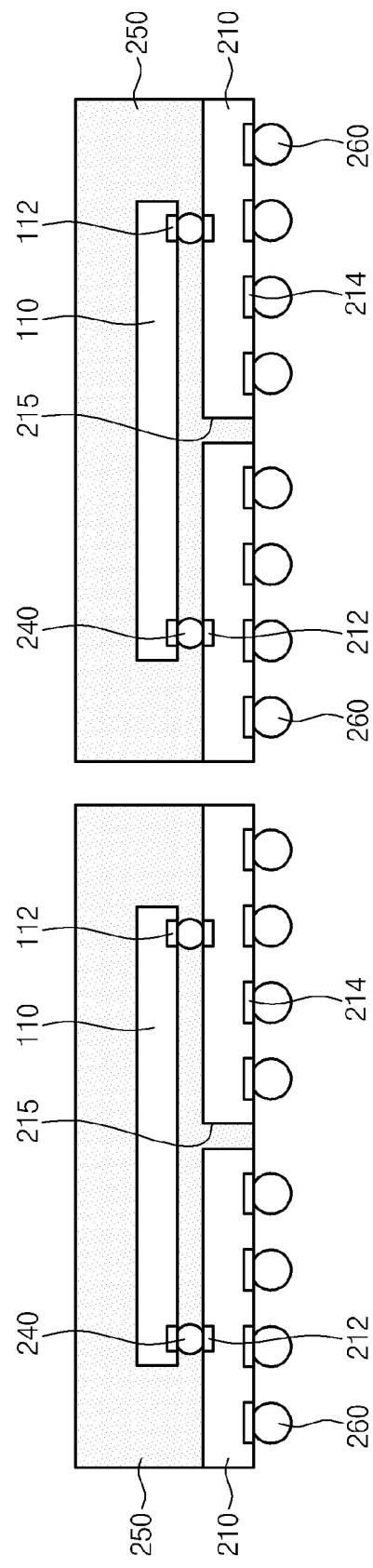

SEMICONDUCTOR PACKAGE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2012-0085836, filed on Aug. 6, 2012, the entirety of which is incorporated by reference herein.

BACKGROUND

This disclosure relates to a semiconductor package and a method of fabricating the same and, more particularly, to a semiconductor package including a semiconductor chip mounted by a flip chip bonding method and a method of fabricating the same.

It is a recent trend to inexpensively fabricate electronic products of lightness, small size, high speed, multi-function, and high performance. A packaging technique used to fabricate such products is an important technique for achieving this trend. Recently, a chip scale package (CSP) technique has been suggested. The CSP technique may provide a small semiconductor package of a semiconductor chip scale.

Often, a mass storage of the semiconductor package is demanded in combination with a small size of the semiconductor package. However, a technique capable of integrating a lot of cells in a limited space of the semiconductor chip is needed for increasing a memory capacity of the semiconductor package. This technique may require a high level technique for forming fine patterns and a long developing time. Thus, techniques of highly integrating a semiconductor package using a semiconductor chip and/or a semiconductor package have been developed for easily realizing mass storage semiconductor packages. For example, various researches have been conducted for a multi-chip stacked package including three-dimensionally stacked semiconductor chips or a stack type semiconductor package including three-dimensionally stacked semiconductor packages.

SUMMARY

Embodiments disclosed herein may provide a semiconductor package capable of increasing a freedom degree of a solder ball layout.

Embodiments disclosed herein may also provide a method of fabricating a semiconductor package capable of increasing a freedom degree of a solder ball layout.

In one embodiment, a semiconductor package is disclosed. The semiconductor package includes a wiring board including a mounting region and a molding region surrounding the mounting region, the wiring board having a through-hole passing through at the mounting region; a semiconductor chip mounted on the mounting region of the wiring board by a flip chip bonding method; and a molding covering the molding region of the wiring board and the semiconductor chip and filling the through-hole and a space between the semiconductor chip and the wiring board. The wiring board has a first surface on which the semiconductor chip is mounted, and a second surface opposite to the first surface. A portion of the molding filling the through-hole has a surface coplanar with the second surface of the wiring board.

In one embodiment, the wiring board includes first connection pads provided on the first surface and second connection pads provided on the second surface. The semiconductor chip includes bonding pads electrically connected to the first connection pads of the wiring board. The bonding pads of the semiconductor chip are arranged along an edge of the semiconductor chip, such that the semiconductor chip has an edge type bonding pad array.

In one embodiment, the semiconductor package may additionally include mounting connection terminals provided on the bonding pads of the semiconductor chip, respectively.

In one embodiment, the semiconductor package may additionally include external connection terminals provided on the second connection pads of the wiring board, respectively.

In one embodiment, the molding includes an epoxy molding compound.

In one embodiment, a method of fabricating a semiconductor package is disclosed. The method includes preparing a wiring board including at least a first mounting region and a first molding region surrounding the first mounting region; forming a sacrificial layer on a first surface of the wiring board; forming at least a first through-hole, the first through-hole passing through the wiring board at the mounting region and passing through the sacrificial layer; mounting at least one semiconductor chip on a second surface of the wiring board opposite the first surface, the at least one semiconductor chip mounted in the mounting region and physically and electrically connected to the wiring board using a plurality of interconnection terminals; and forming a molding, the molding covering the at least one semiconductor chip, filling in a space between the wiring board and the at least one semiconductor chip not filled in by the interconnection terminals, and filling at least the first through-hole.

In one embodiment, the sacrificial layer has a first surface contacting the first surface of the wiring board, and a second surface opposite the first surface, and the method further includes forming a portion of the molding below the first surface of the wiring board and that contacts the sacrificial layer.

The method may additionally include removing the sacrificial layer and the portion of the molding below the first surface of the wiring board. In one embodiment, after the removing step, a surface of the molding in the first through-hole is coplanar with the first surface of the wiring board.

In one embodiment, the portion of the molding below the first surface of the wiring board contacts the second surface of the sacrificial layer.

In one embodiment, preparing the wiring board comprises forming a plurality of external connection pads on the first surface of the wiring board; and forming a plurality of bonding pads on the second surface of the wiring board. Preparing the sacrificial layer may include forming the sacrificial layer to cover the plurality of external connection pads.

In one embodiment, an adhesive strength between the sacrificial layer and the wiring board is less than an adhesive strength between the sacrificial layer and the molding.

In one embodiment, the first through-hole is formed in a center of the mounting region.

The method may further comprise including in the wiring board a plurality of mounting regions and a plurality of molding regions, each molding region surrounding a respective mounting region; forming a plurality of through-holes, each through-hole corresponding to a respective mounting region and, each through-hole passing through the wiring board at the respective mounting region and passing through the sacrificial layer; and mounting a plurality of semiconductor chips on the second surface of the wiring board opposite the first surface, each semiconductor chip mounted in a respective mounting region and physically and electrically connected to the wiring board using a plurality of interconnection terminals. For each semiconductor chip, the molding may covers the semiconductor chips, fill in a space between the wiring board and semiconductor chip not filled in by the interconnection terminals, and fill the through-hole that corresponds to the semiconductor chip. The plurality of semiconductor chips may then be singulated from each other.

In one embodiment a method of manufacturing a semiconductor package includes preparing a wiring board including a mounting region and a molding region surrounding the mounting region; forming a through-hole penetrating through the wiring board at the mounting region; mounting a semiconductor chip on the mounting region of the wiring board by a flip chip bonding method; and forming a molding covering the molding region of the wiring board and the semiconductor chip and filling the through-hole and a space between the semiconductor chip and the wiring board. The wiring board has a first surface on which the semiconductor chip is mounted, and a second surface opposite to the first surface, and a portion of the molding filling the through-hole has a surface coplanar with the second surface of the wiring board.

In one embodiment, the wiring board includes first connection pads provided on the first surface and second connection pads provided on the second surface.

In one embodiment, the method additionally includes forming a sacrificial layer on the second surface of the wiring board; forming a portion of the molding below the second surface of the wiring board and contacting a surface of the sacrificial layer; and removing the sacrificial layer and the portion of the molding below the second surface of the wiring board.

An adhesive strength between the sacrificial layer and the wiring board may be less than an adhesive strength between the sacrificial layer and the molding.

In one embodiment, a method of fabricating a semiconductor package includes preparing a wiring board including a plurality of mounting regions and molding regions respectively surrounding the mounting regions, the molding regions connected to each other, and each of the mounting regions having a through-hole penetrating therethrough; forming a sacrificial layer having an adhesive property on a first surface of the wiring board, the sacrificial layer having extension through-holes respectively corresponding to the through-holes; mounting a respective semiconductor chip on each of the mounting regions on a second surface opposite to the first surface of the wiring board by a flip chip bonding method; forming a molding covering the semiconductor chips and the second surface of the wiring board, the molding filling spaces between the wiring board and the semiconductor chips, and filling the through-holes and the extension through-holes, and the molding extending to partially cover the sacrificial layer on the first surface of the wiring board; and removing the sacrificial layer to remove portions of the molding which partially cover the sacrificial layer on the first surface of the wiring board and to remove portions of the molding that fill the extension through-holes, respectively.

In one embodiment, the sacrificial layer includes a material having a first adhesive strength with respect to the molding and a second adhesive strength with respect to the wiring board, and the first adhesive strength is greater than the second adhesive strength.

In one embodiment, the sacrificial layer is an adhesive including an ultraviolet curable resin (UV resin) or a thermoplastic.

In one embodiment, the molding includes a material having an adhesive strength with respect to the sacrificial layer greater than an adhesive strength with respect to the wiring board.

In one embodiment, the wiring board includes a first connection pad provided on the first surface and a second connection pad provided on the second surface. The semiconductor chip includes a bonding pad, and mounting the semiconductor chip comprises: electrically connecting the bonding pad of the semiconductor chip to the second connection pad of the wiring board.

BRIEF DESCRIPTION OF THE DRAWINGS

The various embodiments will become more apparent in view of the attached drawings and accompanying detailed description.

FIGS. 2A to 7A are top plan views illustrating a method of fabricating a semiconductor package according to exemplary embodiments;

FIGS. 2B to 7B are bottom plan views illustrating a method of fabricating a semiconductor package according to exemplary embodiments;

FIGS. 2C to 7C are exemplary cross-sectional views taken along lines III-III' of FIGS. 2A to 7A, respectively, according to certain embodiments;

FIGS. 2D to 7D are exemplary cross-sectional views taken along lines IV-IV' of FIGS. 2A to 7A, respectively, according to certain embodiments;

DETAILED DESCRIPTION

Figure 1A:
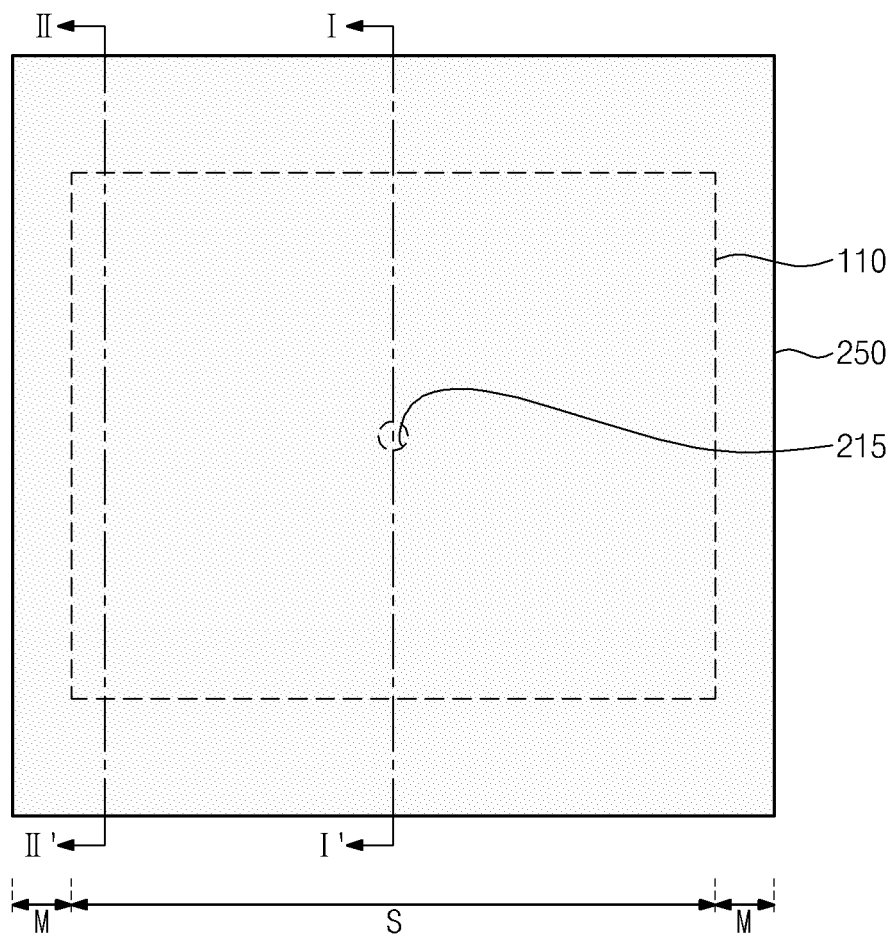
FIG. 1A is a top plan view illustrating a semiconductor package according to exemplary embodiments.

Various exemplary embodiments will now be described more fully hereinafter with reference to the accompanying drawings. The advantages and features disclosed herein and methods of achieving them will be apparent from the following exemplary embodiments. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, exemplary embodiments are not limited to the specific examples provided herein and certain sizes and features may be exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on"

another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as ideal exemplary views. Accordingly, shapes of the exemplary views may be modified according to manufacturing techniques and/or allowable errors. Therefore, the embodiments are not limited to the specific shape illustrated in the exemplary views, but may include other shapes that may be created according to manufacturing processes. For example, a region illustrated as a rectangle will, typically, have rounded or curved features. Areas exemplified in the drawings have general properties, and are used to illustrate specific shapes of elements. Thus, this should not be construed as limiting the scope of the inventive concept.

It will be also understood that although the terms first, second, third etc. may be used herein to describe various elements, these elements should not be limited by these terms. Unless indicated otherwise, these terms are only used to distinguish one element from another element. Thus, a first element in some embodiments could be termed a second element in other embodiments without departing from the teachings of the present disclosure. Exemplary embodiments explained and illustrated herein include their complementary counterparts. The same reference numerals or the same reference designators denote the same elements throughout the specification.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Figure 1B:
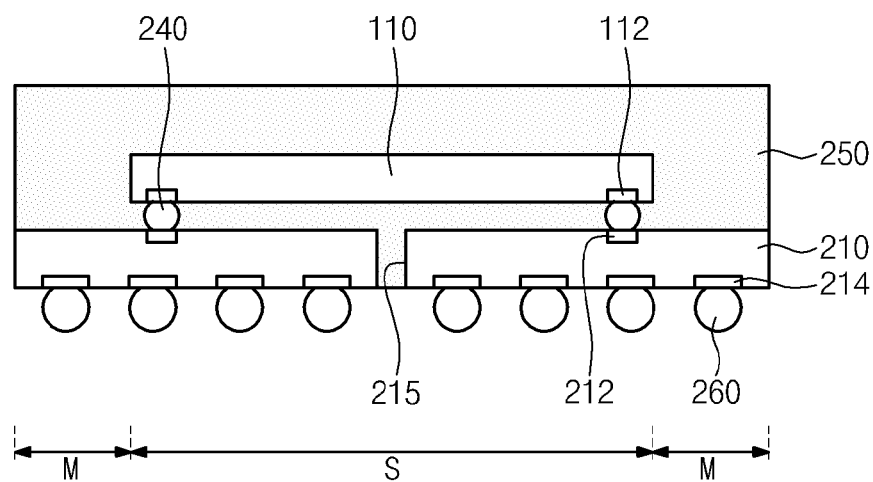
FIGS. 1B and 1C are exemplary cross-sectional views taken along lines I-I' and II-IF of FIG. 1A, respectively, according to certain embodiments.
Figure 1C:
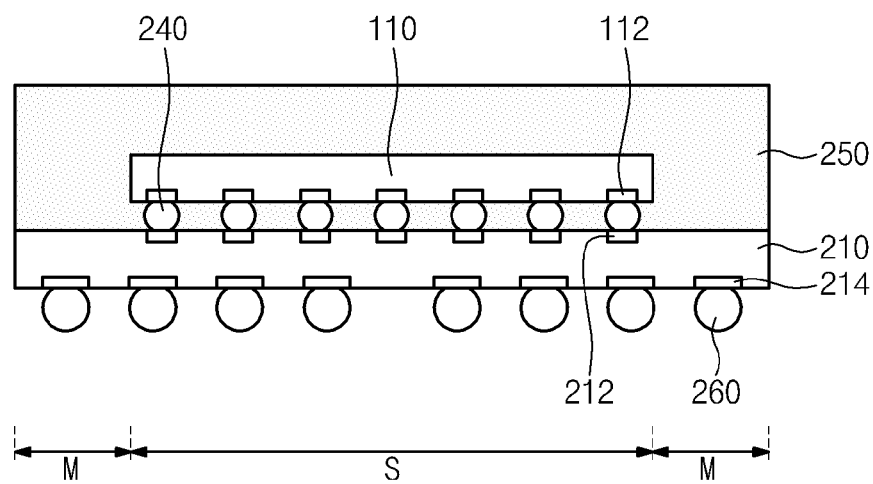
Figure 2A:
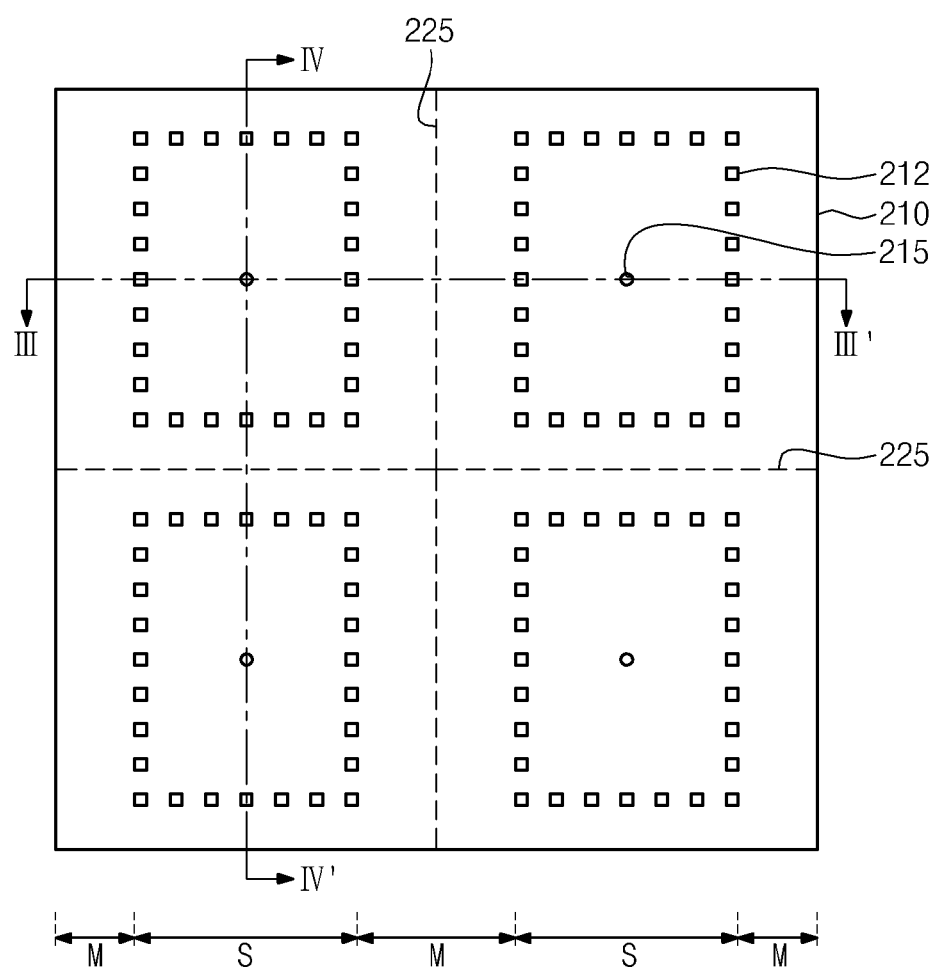
Figure 2B:
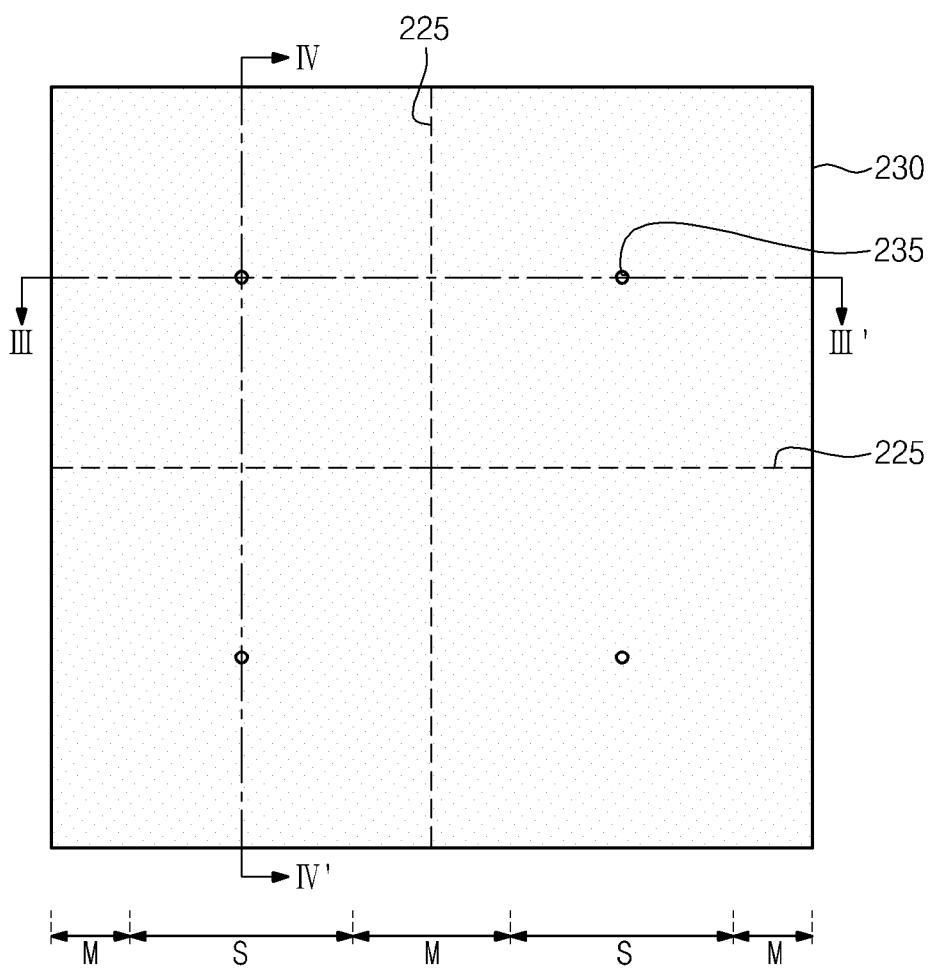
Figure 3A:
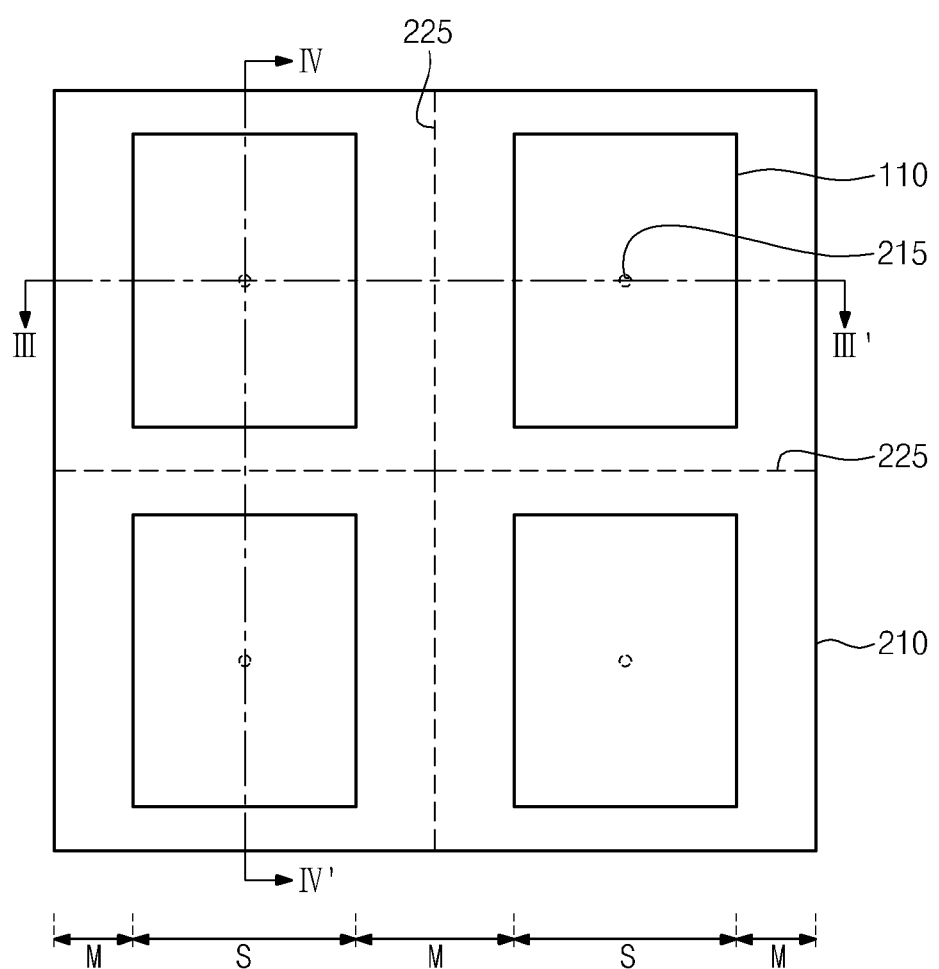
Figure 3B:
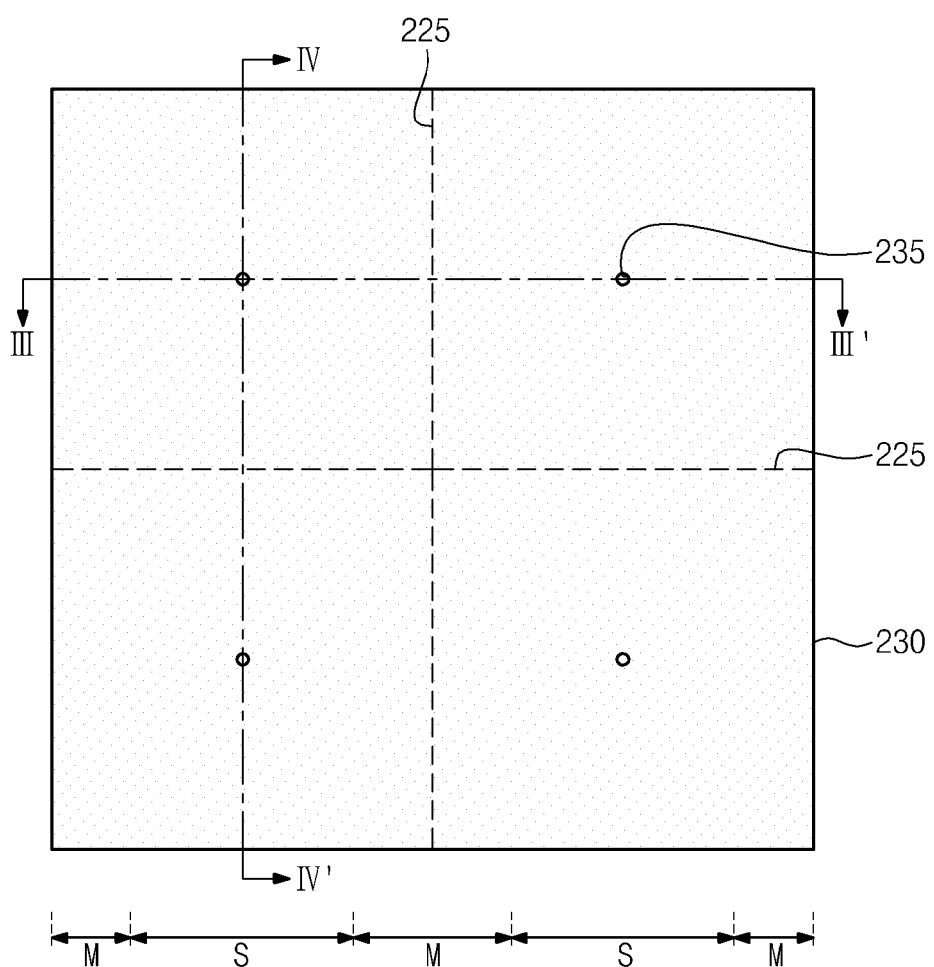
Figure 3C:
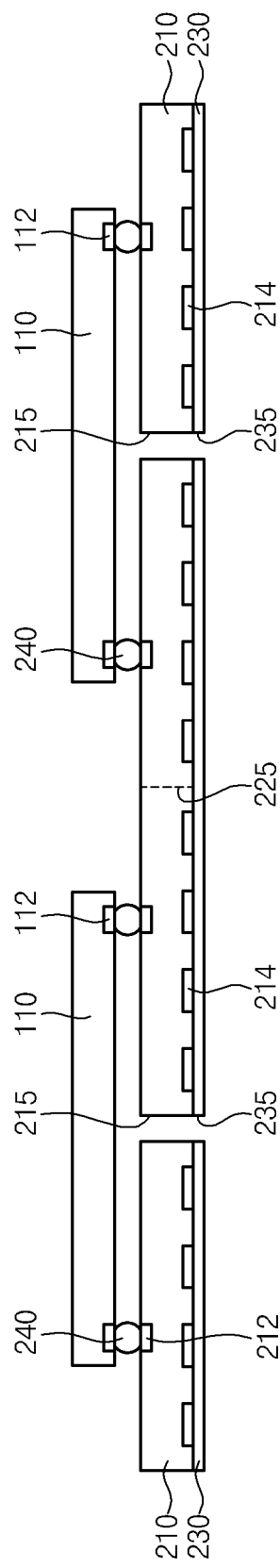
Figure 3D:
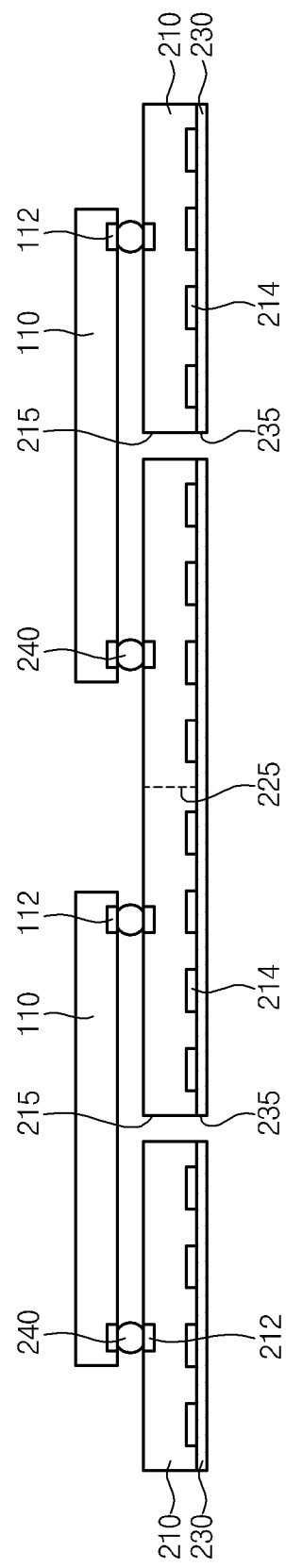

FIG. 1A is a top plan view illustrating a semiconductor package according to exemplary embodiments. FIGS. 1B and 1C are exemplary cross-sectional views taken along lines I-I' and II-IF of FIG. 1A, respectively, according to certain embodiments.

Referring to FIGS. 1A, 1B, and 1C, in one embodiment, a semiconductor package may include a semiconductor chip 110, a wiring board 210, mounting connection terminals 240, and a molding 250.

In one embodiment, the semiconductor chip 110 has bonding pads 112 disposed on an active surface of the semiconductor chip 110. The bonding pads 112 of the semiconductor chip 110 may be arranged along an edge of the active surface, such that the semiconductor chip 110 may have an edge type bonding pad array. The bonding pads 112 may be conductive terminals formed of a metal or other conductive material. Even though not illustrated in the drawings, the semiconductor chip 110 according to exemplary embodiments may be a stacked semiconductor chip group including a plurality of stacked semiconductor chips electrically connected to each other, for example, by through-electrodes. In this case, the bonding pads 112 may be provided on an active surface of a lowermost semiconductor chip of the semiconductor chip group. The through-electrodes penetrating the semiconductor chip group may be electrically connected to the bonding pads 112.

The wiring board 210 may include a mounting region S and a molding region M. The molding region M may surround the mounting region S. In one embodiment, the mounting region S may correspond to a center portion of the wiring board 210, and the molding region M may correspond to an edge portion of the wiring board 210 that surrounds the mounting region S. The mounting region S may correspond to an area where a semiconductor chip 110 is mounted, and the molding region M may correspond to an area not covered by a semiconductor chip 110 (e.g., where no semiconductor chip is mounted). The wiring board 210 may include a through-hole 215 penetrating, for example, a center of the mounting region S. A molding material may smoothly flow by the through-hole 215 during a process for forming the molding 250. Thus, the through-hole 215 may prevent a void from being formed between the semiconductor chip 110 and the wiring board 210.

The wiring board 210 may include top connection pads 212 and bottom connection pads 214 electrically connected to circuit patterns (not illustrated) disposed within the wiring board 210. The top connection pads 212 are disposed at a top surface of the wiring board 210, and the bottom connection pads 214 may be disposed at a bottom surface of the wiring board 210. The top connection pads 212 and the bottom connection pads 214 may be conductive terminals formed, for example, of a conductive material such as a metal. The wiring board 210 may be a printed circuit board (PCB), for example, including a substrate with wiring printed thereon. The top connection pads 212 of the wiring board 210 may be electrically connected to the bonding pads 112 of the semiconductor chip 110, respectively. The semiconductor chip 110 may be mounted on a top surface of the mounting region S of the wiring board 210. External connection terminals 260 may be provided on the bottom connection pads 214 of the wiring board 210, respectively. The external connection terminals 260 may be provided for electrically connecting the semiconductor package to an external circuit. The external connection terminals 260 may be selected, for example, from a group including, for example, conductive bumps, solder balls, conductive spacers, a pin grid array (PGA), or any combination thereof. In some embodiments, the external connection terminals 260 may be solder balls.

The bonding pads 112 of the semiconductor chip 110 may be electrically connected to the top connection pads 212 through the mounting connection terminals 240, respectively. As such, the semiconductor chip 110 may be mounted on the top surface of the mounting region S of the wiring board 210 by a flip chip bonding method. The mounting connection terminals 240, also referred to herein as board-to-chip connection terminals 240, may be selected from a group including, for example, conductive bumps, solder balls, conductive spacers, a pin grid array (PGA), or any combination thereof. In some embodiments, the mounting connection terminals 240 may be solder balls.

The molding 250 may cover the molding region M of the wiring board 210 and the semiconductor chip 110 and may fill the through-hole 215 and a space between the semiconductor chip 110 and the wiring board 210. The portion of the molding 250 filling the through-hole 215 may have a bottom surface coplanar with the bottom surface of the wiring board 210. The molding 250 may include, for example, an epoxy molding compound (EMC). In one embodiment, the molding 250 has a sidewall coplanar with a sidewall of the wiring board 210 in FIGS. 1B and 1C. However, the inventive concept is not limited thereto. In other embodiments, the molding 250 may have an inclined sidewall with respect to the top surface of the wiring board 210.

In the semiconductor package according to exemplary embodiments, the wiring board 210 has the through-hole 215 penetrating through the mounting region S surrounded by the molding region M. The through-hole 215 may be located in a central portion of the mounting region S. Thus, it is possible to prevent the void caused between the semiconductor chip 110 and the wiring board 210 in a molding process of the semiconductor package including the semiconductor chip 110 mounted by the flip chip bonding method. Additionally, a freedom degree of a solder ball layout of the semiconductor chip 110 may increase. As a result, semiconductor chips having various solder ball layouts may be mounted on the wiring board 210 by the flip chip bonding method.

FIGS. 2A to 7A are top plan views illustrating a method of fabricating a semiconductor package according to exemplary embodiments, and FIGS. 2B to 7B are bottom plan views illustrating a method of fabricating a semiconductor package according to exemplary embodiments. FIGS. 2C to 7C are exemplary cross-sectional views taken along lines III-III' of FIGS. 2A to 7A, respectively. FIGS. 2D to 7D are exemplary cross-sectional views taken along lines IV-IV' of FIGS. 2A to 7A, respectively.

Referring to FIGS. 2A, 2B, 2C, and 2D, a wiring board 210 may be prepared. The wiring board 210 may include a plurality of mounting regions S and a plurality of molding regions M surrounding the mounting regions S, respectively. The molding regions M may be connected to each other. The wiring board 210 includes through-holes 215 respectively penetrating the mounting regions S. The through-holes 215 may be located in a center of the mounting regions S. Additionally, the wiring board 210 may include scribe lines 225 for separating semiconductor packages from each other in a subsequent process.

The wiring board 210 may include top connection pads 212 and bottom connection pads 214 which are connected to a circuit pattern within the wiring board 210. The top connection pads 212 may be disposed at a top surface of the wiring board 210 and the bottom connection pads 214 may be disposed at a bottom surface of the wiring board 210. The wiring board 210 may be a printed circuit board (PCB).

Figure 4A:
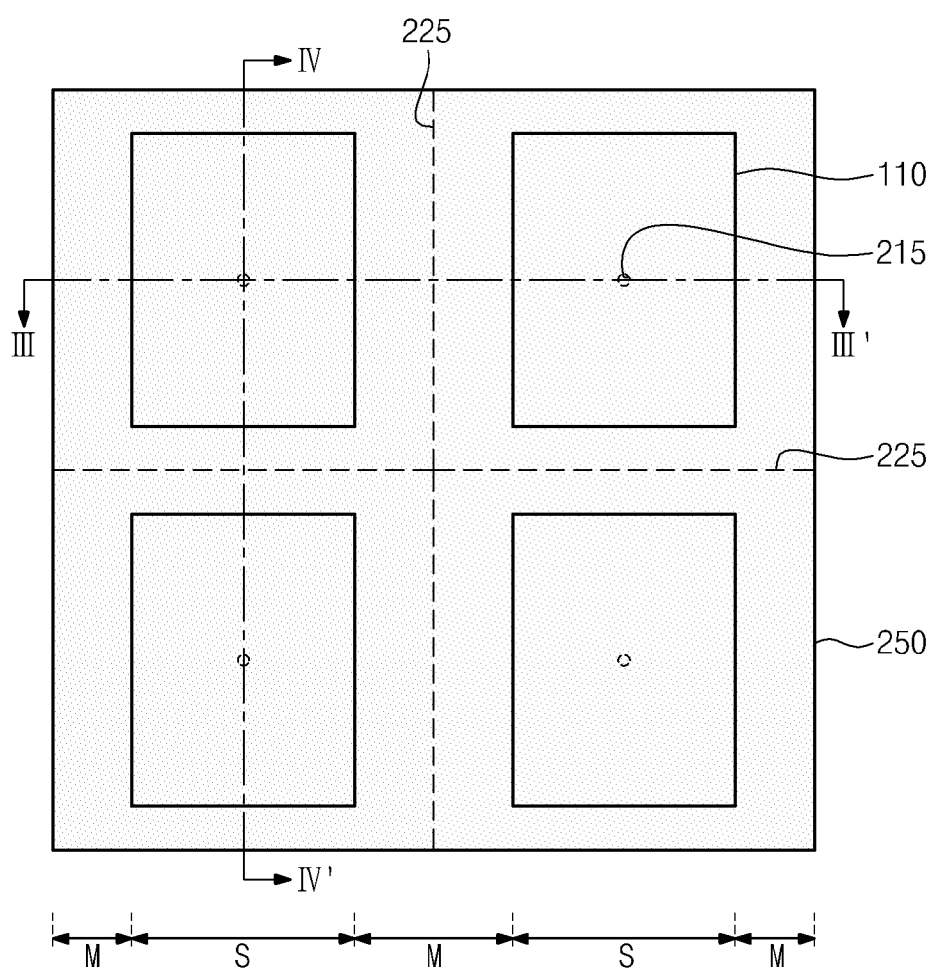
Figure 4B:
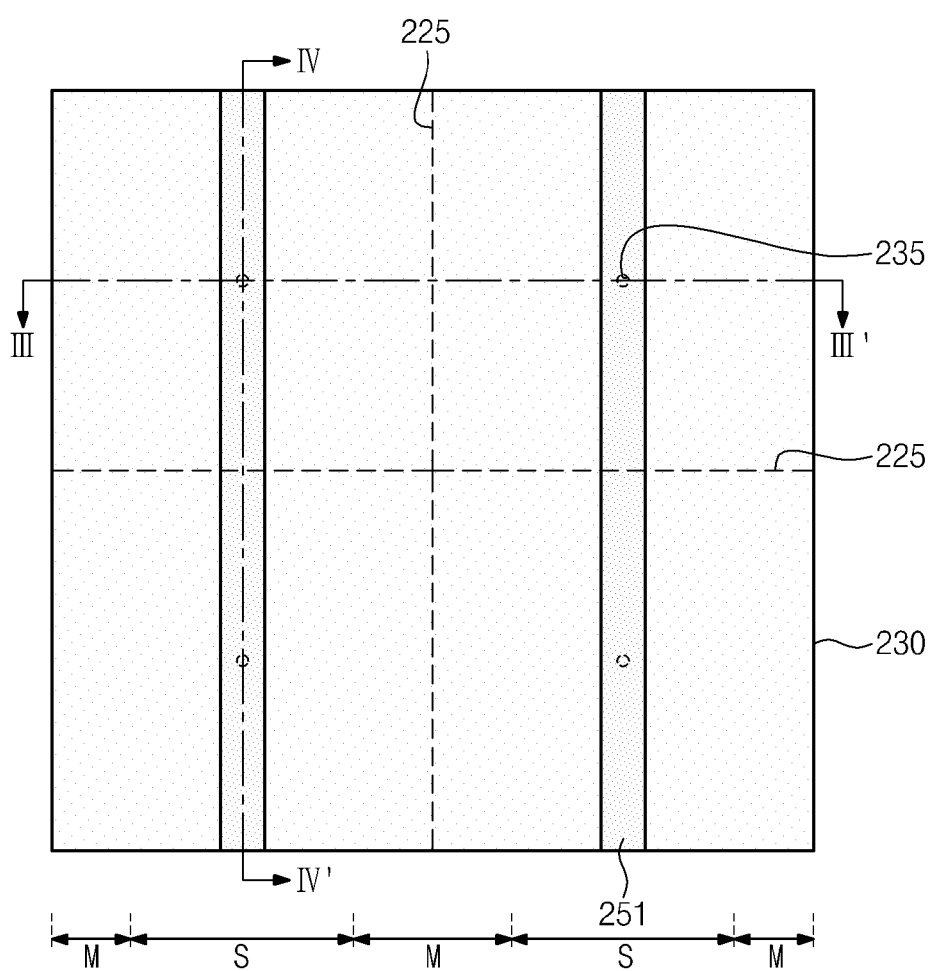
Figure 4C:
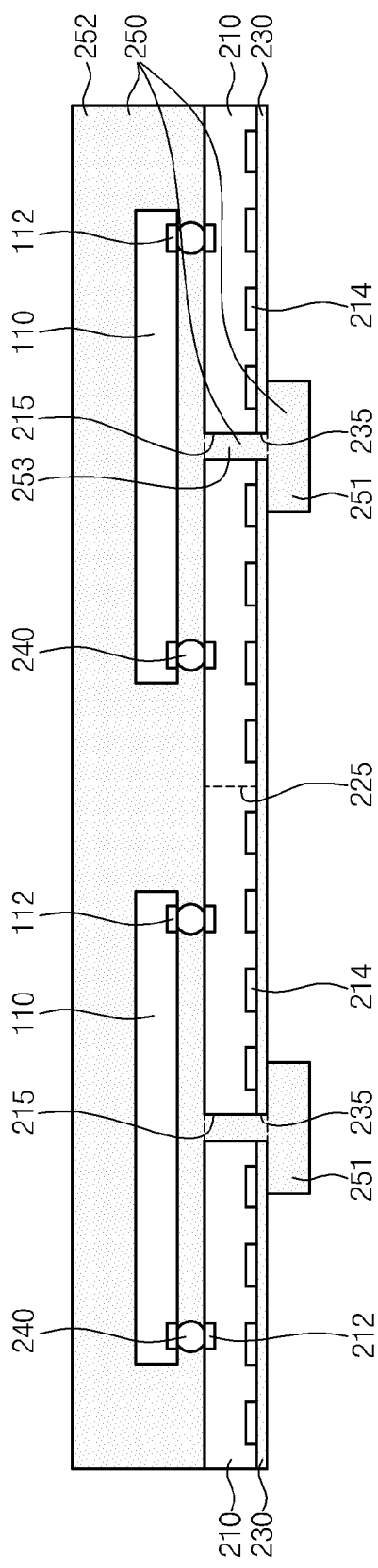
Figure 4D:
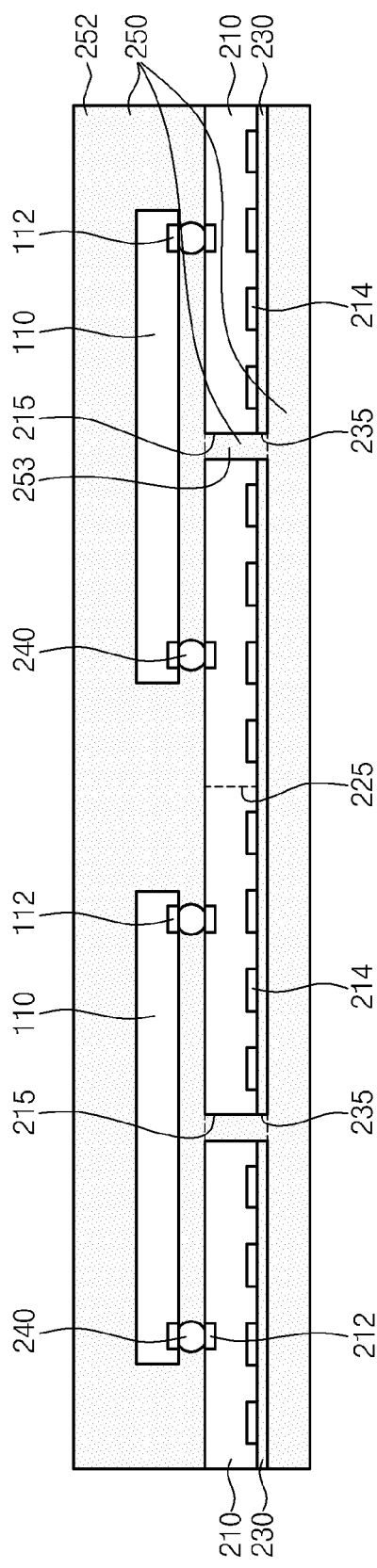
Figure 5A:
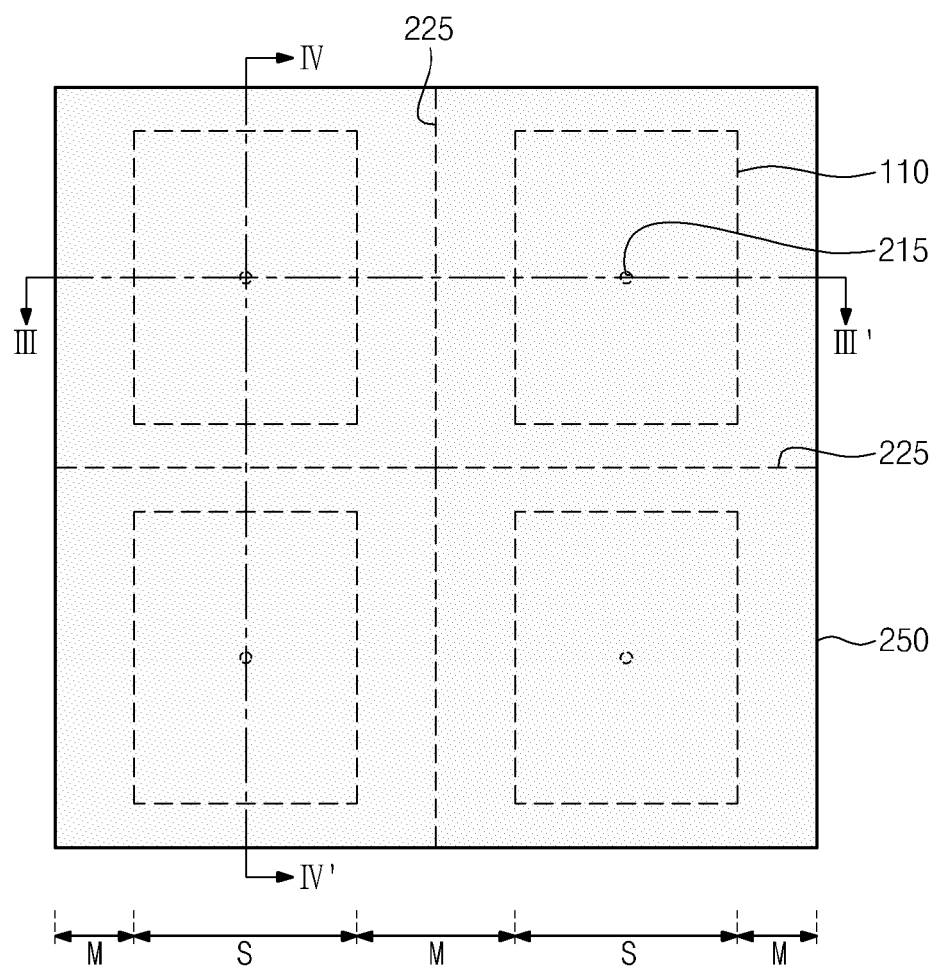
Figure 5B:
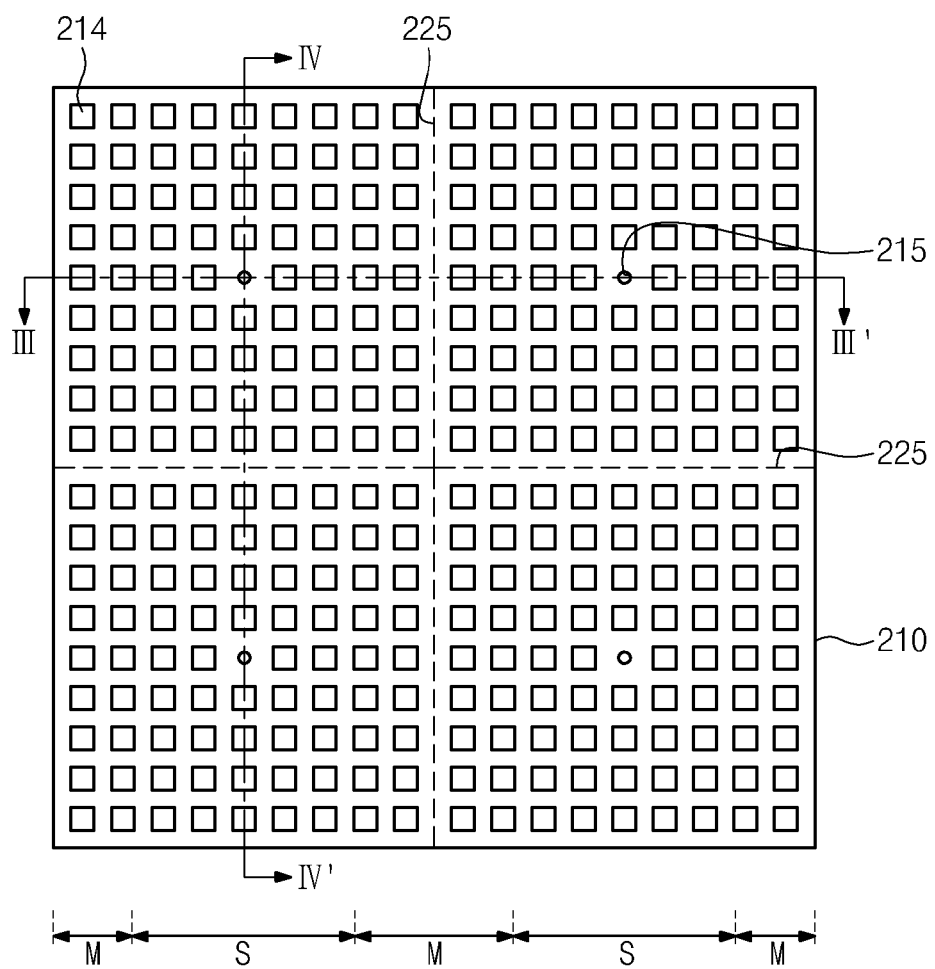
Figure 6A:
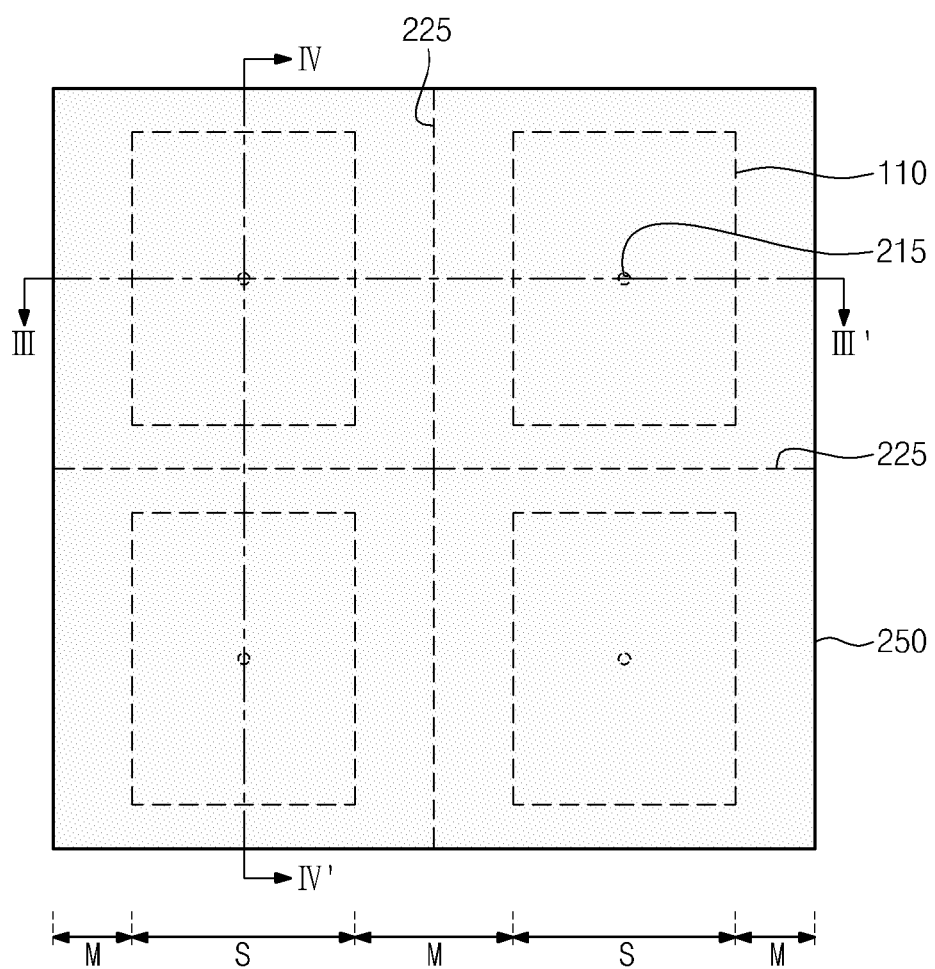
Figure 6B:
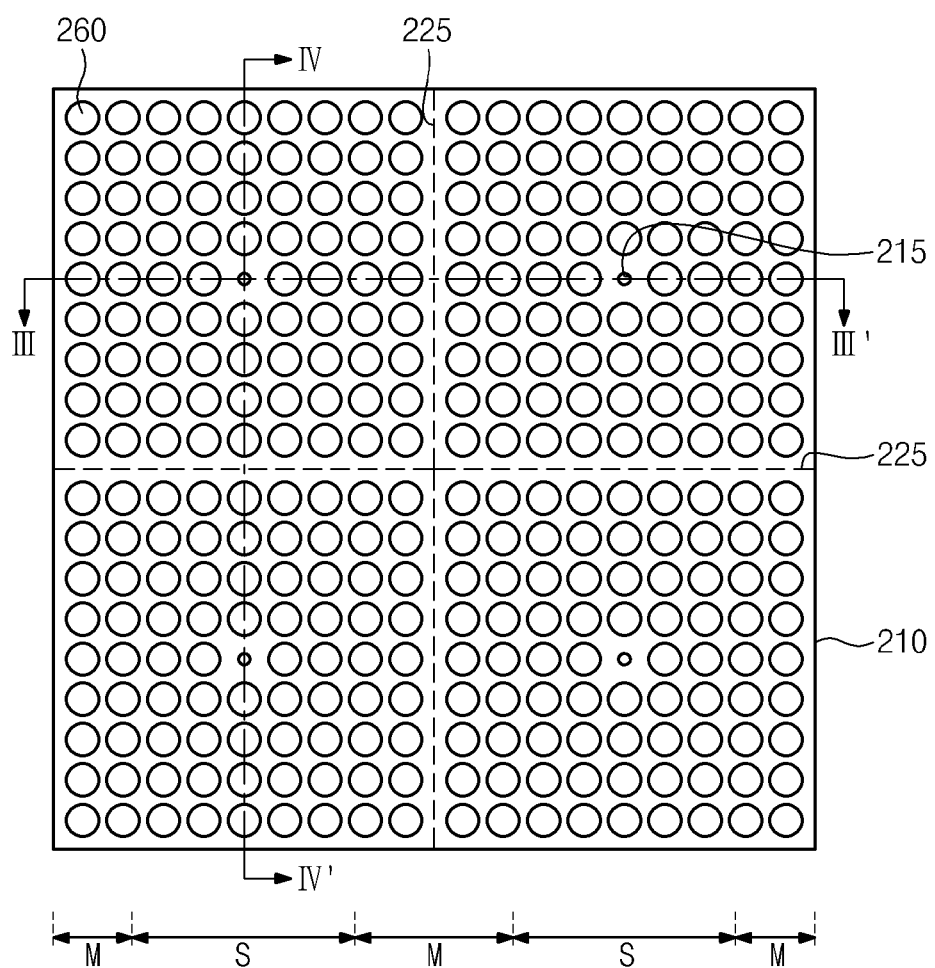
Figure 7A:
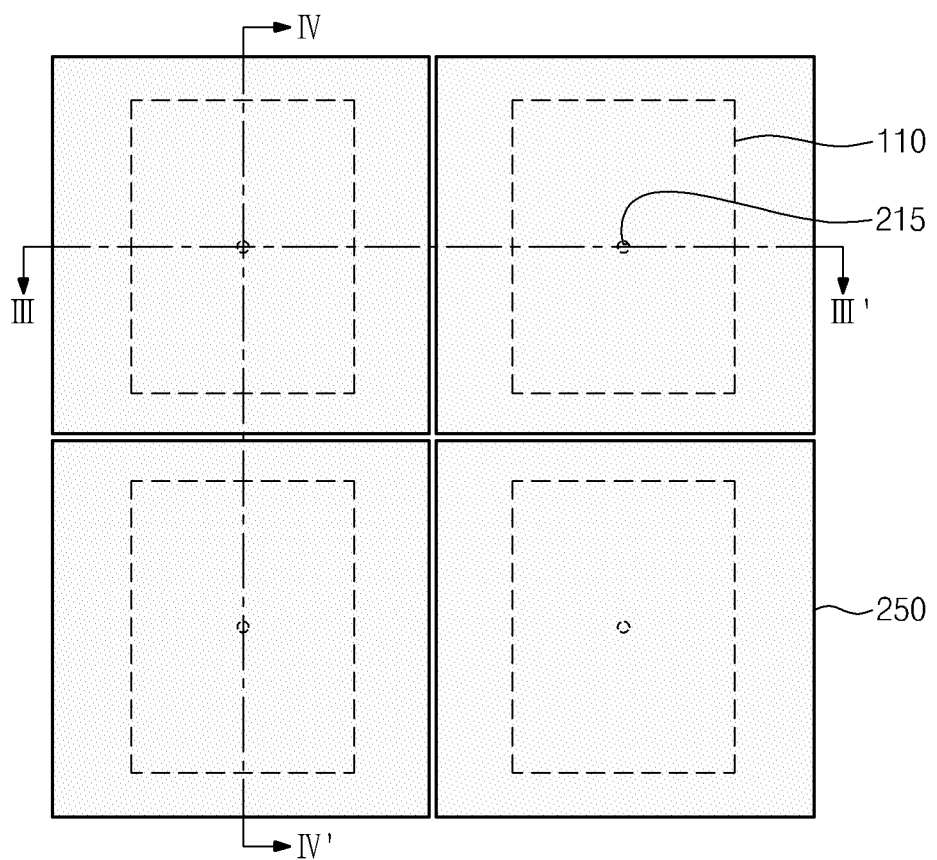
Figure 7B:
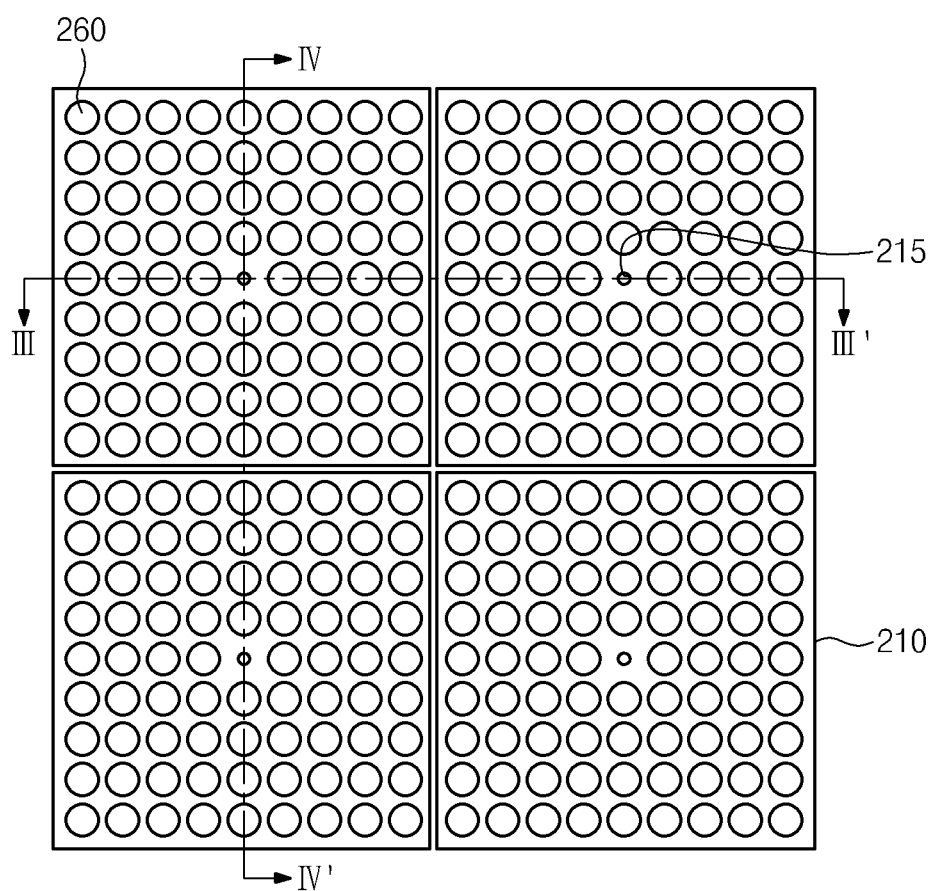

A sacrificial layer 230 having an adhesive property may be formed on the bottom surface of the wiring board 210. The sacrificial layer 230 may have extension through-holes 235 respectively corresponding to the through-holes 215. The sacrificial layer 230 may include a material having a first adhesive strength in relation to a molding 250 of FIG. 4A and a second adhesive strength in relation to the wiring board 210. In one embodiment, the first adhesive strength is greater than the second adhesive strength. As a result, the sacrificial layer 230 may adhere more strongly to the molding 250 than it does to the wiring board 210. After a molding process, portions 251 of the molding 250 may contact the sacrificial layer 230 and partially cover the sacrificial layer 230 on the bottom surface of the wiring board 210 and may fill the extension through-holes 235 as illustrated in FIGS. 4B, 4C, and 4D. Since the sacrificial layer 230 includes a material having the first adhesive strength with respect to the molding 250 of FIG. 4A and the second adhesive strength with respect to the wiring board 210 less than the first adhesive strength, the portions 251 of the molding 250 may be easily removed during a subsequent process of removing the sacrificial layer 230. In one embodiment, the sacrificial layer 230 may include an adhesive including an ultraviolet curable resin (UV resin) or a thermoplastic.

Referring to FIGS. 3A to 3D, a semiconductor chip 110 is mounted on each of the mounting regions S, for example, by a flip chip bonding method. The semiconductor chips 110 are mounted on the top surface of the wiring board 210.

The semiconductor chip 110 has bonding pads 112 disposed on an active surface thereof. The bonding pads 112 of the semiconductor chip 110 may be arranged along an edge of the active surface, such that the semiconductor chip 110 may have an edge type bonding pad array. Even though not illustrated in the drawings, the semiconductor chip 110 according to exemplary embodiments may be a stacked semiconductor chip group including a plurality of stacked semiconductor chips electrically connected to each other, for example, by through-electrodes. In this case, the bonding pads 112 may be provided on an active surface of a lowermost semiconductor chip of the semiconductor chip group. The through-electrodes penetrating the semiconductor chip group may be electrically connected to the bonding pads 112.

The bonding pads 112 of the semiconductor chip 110 may be electrically connected to the top connection pads 212 of the wiring board 210 through mounting connection terminals 240, respectively. As such, the semiconductor chip 110 may be mounted on the top surface of the mounting region S of the wiring board 210 by the flip chip bonding method. The mounting connection terminals 240 may be selected, for example, from a group including conductive bumps, solder balls, conductive spacers, a pin grid array (PGA), or any combination thereof. In some embodiments, the mounting connection terminals 240 may be solder balls.

Referring to FIGS. 4A to 4D, the molding 250 including portions 251, 252, and 253 is formed. The molding 250 may cover the semiconductor chips 110 and the top surface of the wiring board 210 and fill spaces between the wiring board 210 and the semiconductor chips 110, the through-holes 215 and the extension through-holes 235. Additionally, the molding 250 may contact and partially cover the sacrificial layer 230 disposed on the bottom surface of the wiring board 210 and may extend lengthwise in one direction. For example, the molding portion 251 may include a part of the molding 250 located below the wiring board 210, the molding portion 252 may include a part of the molding 250 located above the wiring board 210, and the molding portion 253 may include a part of the molding 250 located within the wiring board 210 and sacrificial layer 230 (e.g., in the through-hole 215 and extension through-hole 235). The molding portion 251 of the molding 250 may have a width greater than a diameter of the extension through-hole 235. The molding 250 may include a material having an adhesive strength in relation to the sacrificial layer 230 greater than its adhesive strength in relation to the wiring board 210. In one embodiment, the molding 250 includes an epoxy molding compound.

The shape of the molding portion 251 partially covering the sacrificial layer 230 may be defined by a shape of a mold used in the molding process for forming the molding 250. Thus, the shape of the molding portion 251 of the molding 250 is not limited to the shape illustrated in FIGS. 4B, 4C, and 4D.

Referring to FIGS. 5A to 5D, in one embodiment, the sacrificial layer 230 is removed for removing the molding portions 251 of the molding 250 which partially cover the sacrificial layer 230 and fill the extension through-holes 235. As described above, in one embodiment, since the sacrificial layer 230 includes the material having the first adhesive strength with respect to the molding 250 of FIG. 4A and the second adhesive strength with respect to the wiring board 210 less than the first adhesive strength, the molding portions 251 of the molding 250 may be easily removed during the process of removing the sacrificial layer 230. As a result, portions of the molding 250 filling the through-holes 215 (e.g., the molding portion 253 in FIGS. 4C and 4D) may have bottom surfaces substantially coplanar with the bottom surface of the wiring board 210.

Alternatively, a portion of the molding 250 that fills the extension through-holes 235 may remain on the bottom surface of the wiring board 210 after the removal of the sacrificial layer 230. In this case, a grinding process may be additionally performed to remove these remaining portions of the molding 250.

Referring to FIGS. 6A to 6D, external connection terminals 260 may be formed on the bottom connection pads 214, respectively. The external connection terminals 260 may be provided for electrically connect a semiconductor package to an external circuit. The external connection terminals 260 may be formed of a conductive material selected, for example, from a group including conductive bumps, solder balls, conductive spacers, a pin grid array (PGA), or any combination thereof. In some embodiments, the external connection terminals 260 may be solder balls.

Alternatively, after the wiring board 210 including the plurality of mounting regions S is divided into semiconductor packages, the external connection terminals 260 may be formed on the bottom connection pads 214 of the wiring board 210 of each of the semiconductor packages.

Referring to FIGS. 7A to 7D, the wiring board 210 and the molding 250 may be cut using a cutting apparatus along the scribe lines 225 of the wiring board 210, such that the semiconductor packages are separated from each other. In one embodiment, after singulation, a sidewall of the molding 250 of each semiconductor package is coplanar with a sidewall of the wiring board 210 of each semiconductor package in FIGS. 7A to 7D. However, the inventive concept is not limited thereto. In other embodiments, the molding 250 may have an inclined sidewall with respect to the top surface of the wiring board 210 in the semiconductor package.

According to the method of forming the semiconductor package described above, the wiring board 210 has the through-hole 215 penetrating the mounting region S surrounded by the molding region M. The through-hole 215 may be disposed at a center of the mounting region S. Thus, it is possible to prevent a void caused between the semiconductor chip 110 and the wiring board 210 in the molding process. Additionally, the freedom degree of a solder ball layout of the semiconductor chip 110 may increase. As a result, semiconductor chips having various solder ball layouts may be mounted on the wiring board 210 by the flip chip bonding method.

Additionally, in one embodiment, the sacrificial layer having the extension through-hole 235 is supplied to the bottom surface of the wiring board 210, and the extension through-hole 235 corresponds to the through-hole 215 of the wiring board 210. Thus, it is possible to prevent the void caused between the semiconductor chip 110 and the wiring board 210 in the molding process, and the freedom degree of a solder ball layout of the semiconductor chip 110 may increase. As a result, semiconductor chips having various solder ball layouts may be mounted on the wiring board 210 by the flip chip bonding method.

Figure 8:
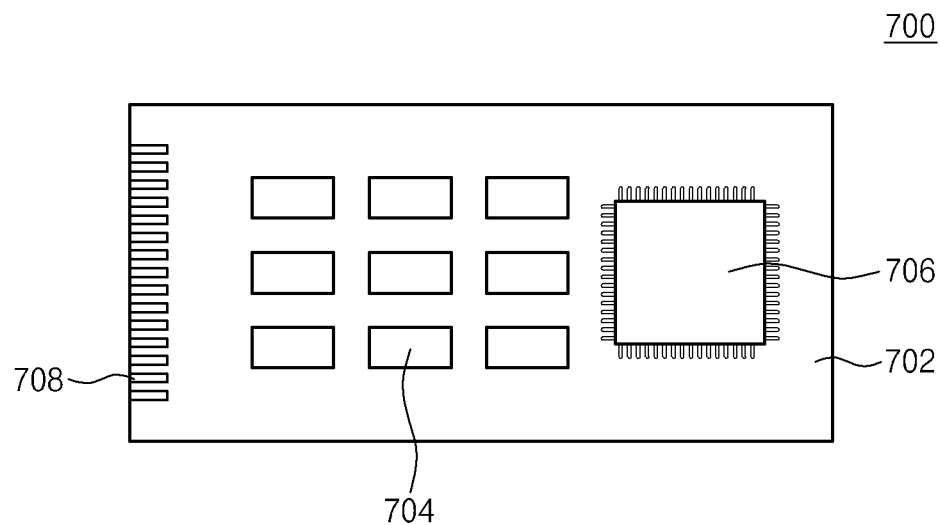
FIG. 8 is a plan view illustrating a package module according to exemplary embodiments.

FIG. 8 is a plan view illustrating a package module according to exemplary embodiments.

Referring to FIG. 8, a package module 700 may include a module board 702 including external connection terminals 708, a semiconductor chip 704 mounted on the module board 702, and a quad flat package (QFP) type semiconductor package 706. The semiconductor package 706 may include the semiconductor packages according to the embodiments disclosed herein. The package module 700 may be connected to an external electronic device through the external connection terminals 708.

Figure 9:
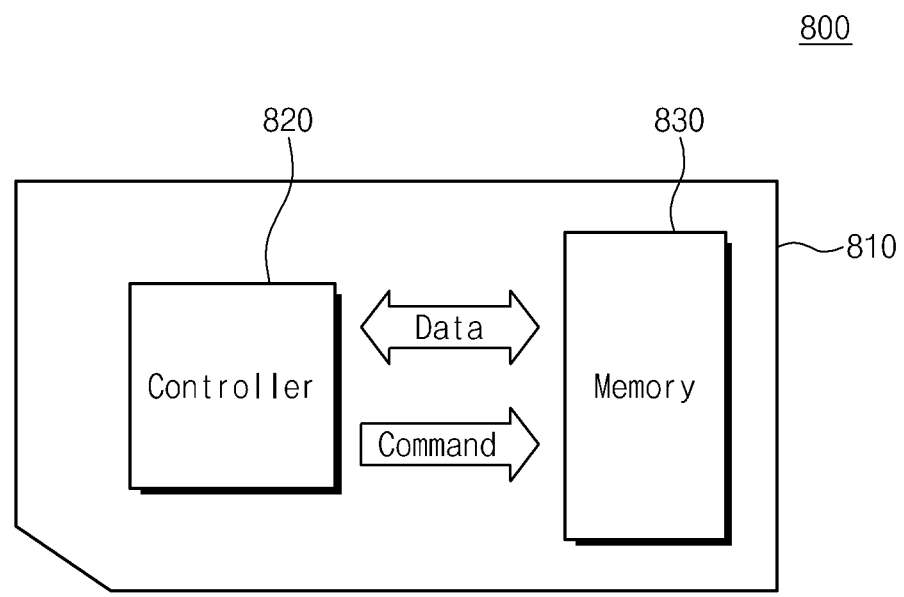
FIG. 9 is a schematic block diagram illustrating a memory card according to exemplary embodiments.

FIG. 9 is a schematic block diagram illustrating a memory card according to exemplary embodiments.

Referring to FIG. 9, a memory card 800 may include a controller 820 and a memory device 830 in a housing 810. The controller 820 and the memory device 830 may exchange electrical signals with each other. For example, the memory device 830 may exchange data with the controller 820 according to commands of the controller 820. Thus, the memory card 800 may store the data in the memory device 830 or output the data stored in the memory device 830 to an external electronic device.

The controller 820 and/or the memory device 830 may include one or more semiconductor packages according to embodiments disclosed herein. For example, the controller 820 may include a system in package and the memory device 830 may include the multi-chip package. In other embodiments, the controller 820 and/or the memory devices 830 may be stack-type packages. The memory card 800 may be used, for example, as data storage mediums installed in various portable devices. For example, the memory card 800 may be used as a multimedia card (MMC) or a secure digital (SD) card.

Figure 10:
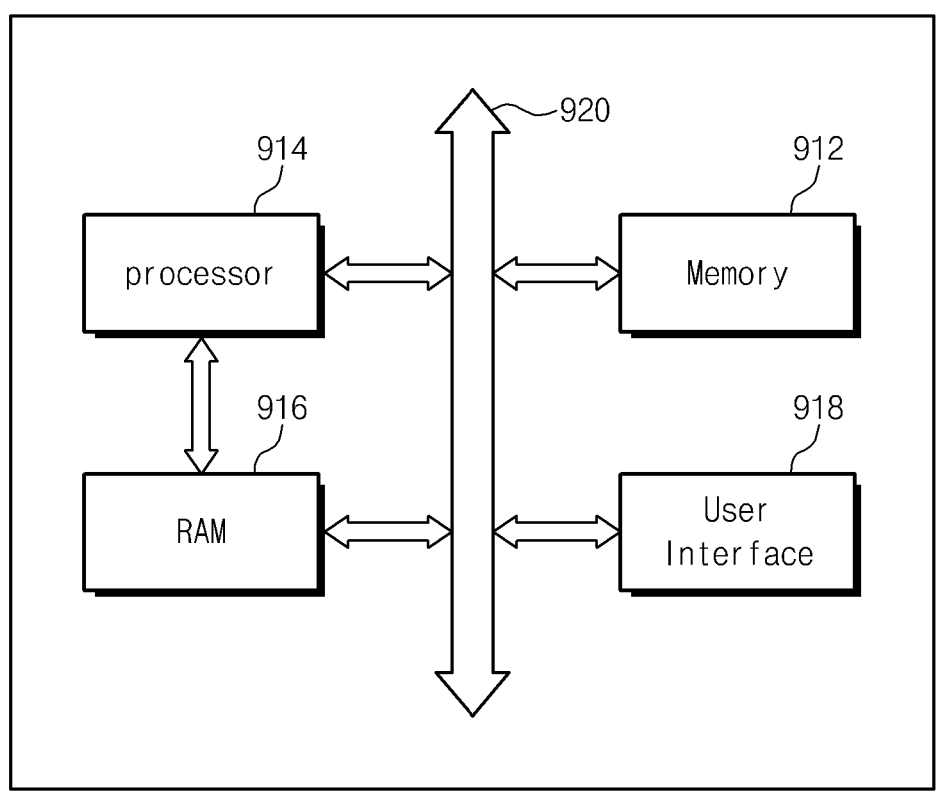
FIG. 10 is a schematic block diagram illustrating an electronic system according to exemplary embodiments.

FIG. 10 is a schematic block diagram illustrating an electronic system according to exemplary embodiments.

Referring to FIG. 10, an electronic system 900 may include one or more semiconductor packages according to embodiments disclosed herein. The electronic system 900 may include a mobile device or a computer. For example, the electronic system 900 may include a memory system 912, a processor 914, a RAM device 916, and a user interface unit 918 which communicate with each other through a data bus 920. The processor 914 may execute a program and control the electronic system 900. The RAM device 916 may be used as an operating memory of the processor 914. For example, each of the processor 914 and the RAM device 916 may include the semiconductor package according to the embodiments disclosed herein. Alternatively, the processor 914 and the RAM device 916 may be included in one package. The user interface unit 918 may be used for data input/output of the electronic system 900. The memory system 912 may store a code for operating the processor 914 and data processed by the processor 914, and/or data inputted from an external electronic device. The memory system 912 may include a controller and a memory device. In one embodiment, the memory system 912 may be the same as the memory card 800 illustrated in FIG. 8.

Figure 11:
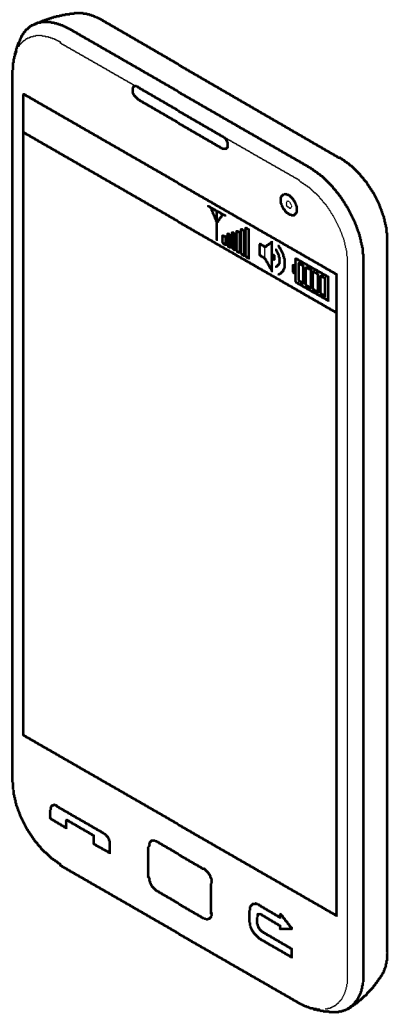
FIG. 11 is a perspective view illustrating an electronic device according to exemplary embodiments.

The electronic system 900 of FIG. 10 may be applied to electronic control elements of various electronic devices. FIG. 11 shows an exemplary device, such as a mobile phone 1000, applied with the electronic system 900 of FIG. 10. In other embodiments, the electronic system 900 of FIG. 10 may be applied to other devices, such as a portable notebook, an MP3 player, a navigation system, a solid state disk (SSD), a car, and/or household appliances.

As described above, the wiring board of the semiconductor package has the through-hole penetrating the mounting region surrounded by the molding region. The through-hole may be located at a center of the mounting region. Thus, it is possible to prevent the void caused between the semiconductor chip and the wiring board in the molding process of the semiconductor package including the semiconductor chip mounted by the flip chip bonding method. Additionally, the freedom degree of the solder ball layout of the semiconductor chip may increase. As a result, semiconductor chips having various solder ball layouts may be mounted on the wiring board by the flip chip bonding method.

Additionally, in one embodiment, the sacrificial layer having the extension through-hole is provided to the bottom surface of the wiring board and the extension through-hole corresponds to the through-hole of the wiring board. Thus, it is possible to better prevent the void caused between the semiconductor chip and the wiring board in the molding process, and the freedom degree of the solder ball layout of the semiconductor chip may increase. As a result, semiconductor chips having various solder ball layouts may be mounted on the wiring board by the flip chip bonding method.

While this disclosure has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of fabricating a semiconductor package, the method comprising:
preparing a wiring board including at least a first mounting region and a first molding region surrounding the first mounting region;
forming a sacrificial layer having a third surface and a fourth surface opposite the third surface, on a first surface of the wiring board by adhering the third surface to the first surface;
forming at least a first through-hole, the first through-hole passing through the wiring board at the mounting region and passing through the sacrificial layer;
mounting at least one semiconductor chip on a second surface of the wiring board opposite the first surface, the at least one semiconductor chip mounted in the mounting region and physically and electrically connected to the wiring board using a plurality of interconnection terminals;
forming a molding, the molding covering the at least one semiconductor chip, filling in a space between the wiring board and the at least one semiconductor chip not filled in by the interconnection terminals, filling at least the first through-hole, and forming a portion of the molding below the first surface of the wiring board and that contacts the sacrificial layer; and
removing the sacrificial layer and the portion of the molding below the first surface of the wiring board,
wherein the sacrificial layer is an adhesive.

2. The method of claim 1, wherein after the removing step, a surface of the molding in the first through-hole is coplanar with the first surface of the wiring board.

3. The method of claim 1, wherein the portion of the molding below the first surface of the wiring board contacts the fourth surface of the sacrificial layer.

4. The method of claim 1, wherein preparing the wiring board comprises:
forming a plurality of external connection pads on the first surface of the wiring board; and
forming a plurality of bonding pads on the second surface of the wiring board.

5. The method of claim 4, wherein preparing the wiring board includes forming the sacrificial layer to cover the plurality of external connection pads.

6. The method of claim 1, wherein an adhesive strength between the sacrificial layer and the wiring board is less than an adhesive strength between the sacrificial layer and the molding.

7. The method of claim 1, wherein the first through-hole is formed in a center of the mounting region.

8. The method of claim 1, further comprising:
including in the wiring board a plurality of mounting regions and a plurality of molding regions, each molding region surrounding a respective mounting region;
forming a plurality of through-holes, each through-hole corresponding to a respective mounting region and, each through-hole passing through the wiring board at the respective mounting region and passing through the sacrificial layer; and
mounting a plurality of semiconductor chips on the second surface of the wiring board opposite the first surface, each semiconductor chip mounted in a respective mounting region and physically and electrically connected to the wiring board using a plurality of interconnection terminals;
wherein for each semiconductor chip, the molding covers the semiconductor chips, fills in a space between the wiring board and semiconductor chip not filled in by the interconnection terminals, and fills the through-hole that corresponds to the semiconductor chip.

9. The method of claim 8, further comprising:
singulating the plurality of semiconductor chips.

10. A method of manufacturing a semiconductor package, the method comprising:
preparing a wiring board including a mounting region and a molding region surrounding the mounting region;
forming a sacrificial layer on a second surface of the wiring board;
forming a through-hole penetrating through the wiring board at the mounting region;
mounting a semiconductor chip on the mounting region of the wiring board by a flip chip bonding method;
forming a molding covering the molding region of the wiring board and the semiconductor chip and filling the through-hole and a space between the semiconductor chip and the wiring board;
forming a portion of the molding below the second surface of the wring board and contacting a surface of the sacrificial layer; and
removing the sacrificial layer and the portion of the molding below the second surface of the wiring board,
wherein the sacrificial is an adhesive;
wherein the wiring board has a first surface on which the semiconductor chip is mounted, and wherein the second surface is opposite to the first surface; and wherein, after the removing step, a portion of the molding filling the through-hole has a surface coplanar with the second surface of the wiring board.

11. The method of claim 10, wherein the wiring board includes first connection pads provided on the first surface and second connection pads provided on the second surface.

12. The method of claim 11, further comprising:
grinding the second surface of the wiring board.

13. The method of claim 11, wherein an adhesive strength between the sacrificial layer and the wiring board is less than an adhesive strength between the sacrificial layer and the molding.

14. A method of fabricating a semiconductor package comprising:
preparing a wiring board including a plurality of mounting regions and molding regions respectively surrounding the mounting regions, the molding regions connected to each other, and each of the mounting regions having a through-hole penetrating therethrough;
forming a sacrificial layer on a first surface of the wiring board, the sacrificial layer having extension through-holes respectively corresponding to the through-holes;
mounting a respective semiconductor chip on each of the mounting regions on a second surface opposite to the first surface of the wiring board by a flip chip bonding method;
forming a molding covering the semiconductor chips and the second surface of the wiring board, the molding filling spaces between the wiring board and the semiconductor chips, and filling the through-holes and the extension through-holes, and the molding extending to partially cover the sacrificial layer on the first surface of the wiring board; and
removing the sacrificial layer to remove portions of the molding which partially cover the sacrificial layer on the first surface of the wiring board and to remove portions of the molding that fill the extension through-holes, respectively,
wherein the sacrificial layer is an adhesive that has a first adhesive strength with respect to the wiring board.

15. The method of claim 14, wherein the sacrificial layer has a second adhesive strength with respect to the molding; and
wherein the second adhesive strength is greater than the first adhesive strength.

16. The method of claim 14, wherein the sacrificial layer comprises an ultraviolet curable resin (UV resin) or a thermoplastic.

17. The method of claim 14, wherein the molding includes a material having an adhesive strength with respect to the sacrificial layer greater than an adhesive strength with respect to the wiring board.

18. The method of claim 14, wherein the wiring board includes a first connection pad provided on the first surface and a second connection pad provided on the second surface;
wherein the semiconductor chip includes a bonding pad; and
wherein mounting the semiconductor chip comprises:
electrically connecting the bonding pad of the semiconductor chip to the second connection pad of the wiring board.

* * * * *